United States Patent
Eichhorn et al.

(10) Patent No.: US 8,664,834 B2
(45) Date of Patent: Mar. 4, 2014

(54) ELECTROMECHANICAL ENERGY CONVERTER FOR GENERATING ELECTRIC ENERGY FROM MECHANICAL MOVEMENTS

(75) Inventors: Christoph Eichhorn, Freiburg (DE); Peter Woias, Freiburg (DE); Frank Goldschmidtboing, Waldkirch (DE)

(73) Assignee: Albert-Ludwigs-Universität Freiburg, Freiburg (DE)

( * ) Notice: Subject to any disclaimer, the term of this patent is extended or adjusted under 35 U.S.C. 154(b) by 318 days.

(21) Appl. No.: 13/127,778

(22) PCT Filed: Nov. 6, 2009

(86) PCT No.: PCT/EP2009/007959
§ 371 (c)(1),
(2), (4) Date: Aug. 29, 2011

(87) PCT Pub. No.: WO2010/052009
PCT Pub. Date: May 14, 2010

(65) Prior Publication Data
US 2011/0304239 A1    Dec. 15, 2011

(30) Foreign Application Priority Data
Nov. 6, 2008  (DE) .......................... 10 2008 056 127

(51) Int. Cl.
*H02N 2/18*  (2006.01)
(52) U.S. Cl.
USPC ............ 310/339; 310/319; 310/329; 310/330
(58) Field of Classification Search
USPC .................................. 310/339, 319, 329, 330
See application file for complete search history.

(56) References Cited

U.S. PATENT DOCUMENTS 3,058,539 A * 10/1962 Adler ............................ 310/322
7,687,977 B2 * 3/2010 Xu ................................ 310/339
(Continued)

FOREIGN PATENT DOCUMENTS

DE        1167076 B    4/1964
DE       10259069 A1   7/2004
(Continued)

OTHER PUBLICATIONS

Yuantai et al. A piezoelectric power harvester with adjustable frequency through axial preloads. Smart Materials and Structures 2007. 16: 1961-1966.
(Continued)

*Primary Examiner* — Derek Rosenau
*Assistant Examiner* — Bryan Gordon
(74) *Attorney, Agent, or Firm* — The Webb Law Firm, P.C.

(57) ABSTRACT

An electromechanical energy converter for generating electric energy from mechanical vibrations has a bending bar clamped to a holder that can be set in vibration and elastically deflected at an end area along a path curve from a neutral position transversely to the longitudinal extension of the bending bar. A deflectable point on the bending bar is connected to the mount via a deflectable bridge part extending along the bending bar for applying to the bending bar a mechanical prestress oriented substantially in the direction of longitudinal extension of the bending bar. The bending bar has a drive connection to at least one electromechanical converter element for converting mechanical vibration energy into electric energy. The bridge part is arranged outside of the bending bar such that when the bending bar is deflected out of the neutral position, the bending bar and the bridge part extend along lines having different courses.

14 Claims, 10 Drawing Sheets

(56) References Cited

U.S. PATENT DOCUMENTS

| | | | |
|---|---|---|---|
| 7,839,058 B1* | 11/2010 | Churchill et al. | 310/339 |
| 7,960,900 B2* | 6/2011 | Caruyer et al. | 310/330 |
| 2006/0175937 A1* | 8/2006 | Clingman et al. | 310/339 |
| 2009/0261689 A1* | 10/2009 | Fang | 310/319 |
| 2010/0141096 A1* | 6/2010 | Churchill et al. | 310/339 |
| 2010/0194240 A1* | 8/2010 | Churchill et al. | 310/319 |

FOREIGN PATENT DOCUMENTS

| | | | |
|---|---|---|---|
| EP | 1573891 | B1 | 11/2007 |
| GB | 2438242 | A | 11/2007 |
| WO | 2004055961 | A2 | 7/2004 |
| WO | 2004055962 | A2 | 7/2004 |
| WO | 2008150536 | A2 | 12/2008 |

OTHER PUBLICATIONS

Go et al. Snapping microswitches with adjustable acceleration threshold. Sensors and Actuators 1996. 54: 579-583.

Shaker. Effect of Axial Load on Mode Shapes and Frequencies of Beams. Nasa Technical Note, Report No. NASA TND-8109, Dec. 1975, 1-31.

Roundy et al. A piezoelectric vibration based generator for wireless electronics. Smart Materials and Structures 2004. 13: 1131-1142.

* cited by examiner

ELECTROMECHANICAL ENERGY CONVERTER FOR GENERATING ELECTRIC ENERGY FROM MECHANICAL MOVEMENTS

BACKGROUND OF THE INVENTION

1) Field of the Invention

The invention relates to an electromechanical energy converter for generating electric energy from mechanical movements, with at least one bending bar that is clamped to a deflectable holder at a fastening point and that can be deflected from a neutral position transversely to the longitudinal extension of the bending bar relative to the fastening point along a trajectory with an free end area separate from the fastening point, whereby a deflectable part of the bending bar is connected to the holder by at least one deflectable bridge part spanning the bending bar for the purpose of creating a mechanical prestress on the bending bar oriented in an essentially longitudinal direction to the bending bar, with a setting mechanism for setting the prestress transferred from the bridge part to the bending bar, and that is connected to the bending bar by at least one electromechanical conversion element used for converting mechanical kinetic energy into electric energy. Movements can specifically include vibrations and/or jolts.

2) Discussion of the Prior Art

This type of energy converter is disclosed in Hu, Yuanttai et al. "A piezoelectric power harvester with adjustable frequency through axial preloads," Smart Materials and Structures 16 (2007), pages 1961-1966. It has a bending bar unilaterally clamped to a holder with a square cross-section that can be elastically deflected in relation to its extension plane with its free end which is separated from the holder. The bending bar has a metal central layer arranged on its extension plane that is coated on its upper and lower side with a piezoelectric layer that runs parallel to the central layer. The holder is excited via a sinusoidal mechanical vibration towards the bending bar extension plane. The vibration causes the free end of the bending bar separated from the holder to elastically deflect to the bending bar extension plane relative to the holder. While deflecting the bending bar, an electrical potential is generated on the piezoelectric layers that feeds an electrical load, like e.g. an electronic microsensor.

To set the bending bar resonance frequency, the central layer has a passage hole in its center that spans the length of the bending bar and is drilled through by a screw that is screwed to the holder via its thread and whose screw head is in contact with the free end of the bending bar. With the help of the screw, the bending bar can be bolted in the axial direction in order to generate a mechanical prestress on the bending bar. With the help of the prestress, it should be possible to change the bending bar resonance frequency and adjust it to the vibration frequency. This should produce a higher efficiency conversion of vibrations into electric energy. With this type of prestress generation, however, only a relatively small amount of electric energy is converted from the mechanical vibration energy, particularly in broadband mechanical exciting vibrations and large exciting amplitudes.

The object is therefore to create an electromechanical energy converter of the aforementioned type with which an efficient conversion of mechanical vibration energy into electric energy can be achieved.

SUMMARY OF THE INVENTION

This objective is achieved in that the bridge part is arranged on the outside of the bending bar in such a way that the bending bar and the bridge part span lines that run different courses, at least when the deflectable bending bar is in a neutral position and a prestress exists.

The line along which the bridge part runs can also deviate from the deflection curve of the bending bar. The lines are independent of each other and do not necessarily need to run along the same course. This makes it possible to introduce a prestress force to the bending bar where the bridge part holds the bending bar, which runs perpendicular to a tangent on the deflection curve at the respective bending bar location, whereby the angle between the tangent and the direction of the prestress force depend on the deflection of the bending bar. Thus, an advantageous broadband excitation of the bending bar is possible. The prestress applied to the bending bar can actually be greater than the Eulerian buckling load of the bending bar, so that the most energy-efficient bending bar position can no longer be found in the neutral bending bar position, but rather in the deflected bar position on either side of the neutral position. Electric energy can then be obtained with each buckling of the bending bar. Of course it is also possible to select a prestress force that is less than the Eulerian buckling load, specifically in order to achieve a high yield from the vibration-capable system created by the bending bar and the bridge part. If the prestress force is significantly less than the Eulerian buckling load, the bending bar primarily vibrates sinusoidally. Increased prestress force excites more harmonics in the bending bar, whereby, for example, jolt or spring excitement vibrations can be used to generate electric energy.

In an advantageous embodiment of the invention, the bridge part is clamped to the holder and designed to be elastically deflectable in its plane. The electromechanical energy converter thereby allows a simple construction.

In another advantageous embodiment of the invention, the bridge part is deflectably arranged on the holder at a first joint point, which is separated from the deflectable point of the bending bar, via a first swivel point and/or arranged on the bending bar at a second joint point, which is separated from the clamping point, via a second swivel point, whereby a swivel axis of the first swivel point and/or a swivel axis of the second swivel point advantageously runs along the trajectory plane, along which the free end area of the bending bar can be deflected. The bridge part's resonance then only slightly increases the bending bar's dampening, so that the mechanical vibration energy can still be converted into electric energy at a low loss rate. The first swivel joint and/or the second swivel joint is (are) preferably designed as flexure hinges.

In an advantageous embodiment of the invention, in the bridge part's neutral position, the bending bar and at least one bridge part span the same plane and are displaced parallel to each other and the bending bar's longitudinal extension. The bending bar and the at least one bridge part can then be integrally connected to each other and be designed as an economically manufacturable two-dimensional part.

In another embodiment of the invention, the at least one bridge part is separated from the bending bar transversely from the longitudinal extension preferably by a slotted open space spanning the bending bar, whereby the bridge part is connected to the deflectable point of the bending bar, at the bridge part's end that is attached to the holder, via a crosslinked part. The mechanical vibration energy can then be converted even more efficiently. The bridge part, the crosspiece, the bending bar and, if appropriate, the holder can be integrally connected to each other.

It is advantageous if the bending bar and the at least one bridge part are arranged on offset planes that run parallel to each other in their neutral position, in the direction of the trajectory, along which the free end area of the bending bar can be deflected, and are separated from each other in the direction of the trajectory by a movement space. The bending bar and the bridge part are then arranged above one another, which enables a compact design.

The at least one converter element is preferably a Piezo element that is integrated into the bending bar and preferably arranged on a layer near the surface of the bending bar. This can reduce the manufactured size of the electromechanical energy converter even further.

In an advantageous embodiment of the invention, the setting element has at least one Piezo element as a controlling element that is arranged between the bridge part and the holder and/or between the bridge part and the bending bar and/or integrated into the bridge part. With the help of the Piezo element, the prestress force for the bending bar can be easily generated and, if appropriate, adapted to the frequency spectrum of the mechanical vibrations. The setting element can also be arranged in at least one layer near the surface of the bridge part.

It is advantageous if at least one arm is integrally molded to the holder spanning transversely to the longitudinal extensions of the bending bar that has an arm section that can be deflected transversely to the longitudinal extensions of the bending bar relative to the holder, whereby this arm section is connected to the deflectable point on the bending bar and whereby the setting element is arranged between the arm section and a bearing point arranged on the holder. A relatively large constructed space can then be provided for the setting element between the holder and the arm. Furthermore, the arm can be used as a lever in order to transfer the setting element displacement above or below the bridge parts.

It is advantageous if the electromechanical energy converter has at least two bridge parts and if the bending bar is arranged symmetrically between these bridge parts. The bending bar is then stabilized against torsion along its longitudinal axis. It is also possible that the electromechanical energy converter has at least two bending bars and that the bridge part is arranged symmetrically between these bending bars. This measure can also prevent bending bar torsion vibrations.

In a preferred embodiment of the invention, the electromechanical energy converter has a control mechanism with a control signal input that is dependent upon the frequency of the holder's mechanical vibration, whereby the control mechanism is connected to the setting mechanism in such a way that the prestress can be set depending on the frequency of the mechanical vibration. The resonance frequency of the bending bar adapts advantageously to the frequency or the frequency band of the mechanical vibration in such a way that as large a part as possible of the mechanical vibration energy is converted into electric energy.

Advantageously, the control mechanism and/or an energy store electrically connected to the converter element and/or an electric load attached to a converter element are arranged on the bending bar at a distance from the fastening point, preferably at the free end area of the bending bar. The control mechanism, the energy store and/or the electrical load can then be used as a seismic mass that reduces the bending bar's resonance frequency. Furthermore, the additional seismic mass increases the conversion efficiency. Via the bending bar, the listed electrical components are also spring-loaded against mechanical impacts on the holder. The electrical connection between the control mechanism, the energy store and/or the electrical load can be realized by the conductors integrated in the bending bar.

It is advantageous if the electromechanical energy converter has a measurement mechanism for detecting a change in the electric output emitted by the converter element and means for capturing frequency changes in the bending bar's mechanical vibration, and if the measurement mechanism and the means for capturing frequency change cooperate via a control circuit with a setting mechanism in such a way that a simultaneous capture of frequency and output causes the setting element of the setting mechanism to adjust in terms of a reduction of resonance frequency of the bending bar and/or an increase in frequency and simultaneous capture of output causes the setting element of the setting mechanism to adjust in terms of an increase in resonance frequency of the bending bar.

This adjusts the working point of the energy converter in the event of a change in exciting frequency at the holder in either direction of the operation point, by the energy converter emitting its maximum electrical output. Adjustment of the working point preferably occurs until the emitted electrical output is no longer changing and the working point is therewith at the operational point at which the energy converter emits its maximum electrical output.

BRIEF DESCRIPTION OF THE DRAWINGS

Illustrative embodiments of the invention are explained in greater detail in the following, with reference to the drawings. Shown are.

DETAILED DESCRIPTION OF THE PREFERRED EMBODIMENTS

Figure 1:
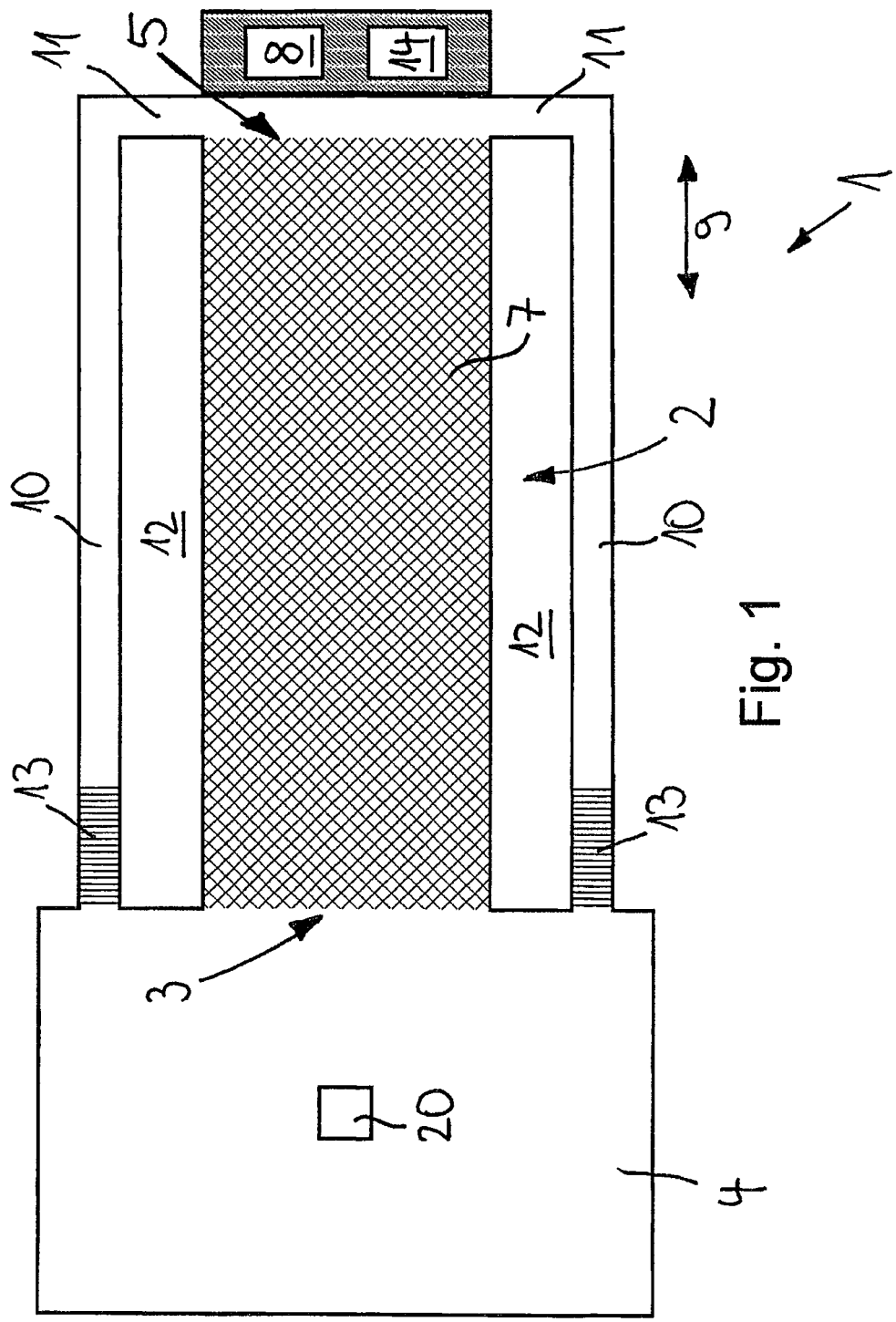
FIG. 1 A view from above of a first illustrative embodiment of an electromechanical energy converter that has a bending bar unilaterally clamped to a holder and that can be deflected vertically to the drawing plane, FIG. 2 A longitudinal section of the energy converter shown in FIG. 1, whereby the solid line represents the energy converter it its neutral position and the dotted line represents the energy converter it its deflected position, and where the deflection is shown in enlargement, FIG. 3 A view from above of a second illustrative embodiment of the energy converter, FIG. 4 A longitudinal section of a third illustrative embodiment of the energy converter, whereby the solid line represents the energy converter it its neutral position and the dotted line represents the energy converter it its deflected position, and where the deflection is shown in enlargement, FIG. 5 A longitudinal section of a fourth illustrative embodiment of the energy converter, FIG. 6 A view from above of a fifth illustrative embodiment of the energy converter, FIG. 7 A view from above of a sixth illustrative embodiment of the energy converter, FIG. 8 A view from above of a seventh illustrative embodiment of the energy converter, FIG. 9 A view from above of an eighth illustrative embodiment of the energy converter, and FIG. 10 A view from above of a ninth illustrative embodiment of the energy converter.

An electromechanical energy converter, designated in its entirety by 1 in FIG. 1, for generating electric energy from mechanical vibrations has a micromechanical bending bar 2, which is connected at a fastening point 3 to a holder 4 that can be set in vibration. The bending bar 2 has a square cross-section and a larger bending resistance moment against deformation in the drawing plane than for deformation at a right angle to the drawing plane.

Figure 2:
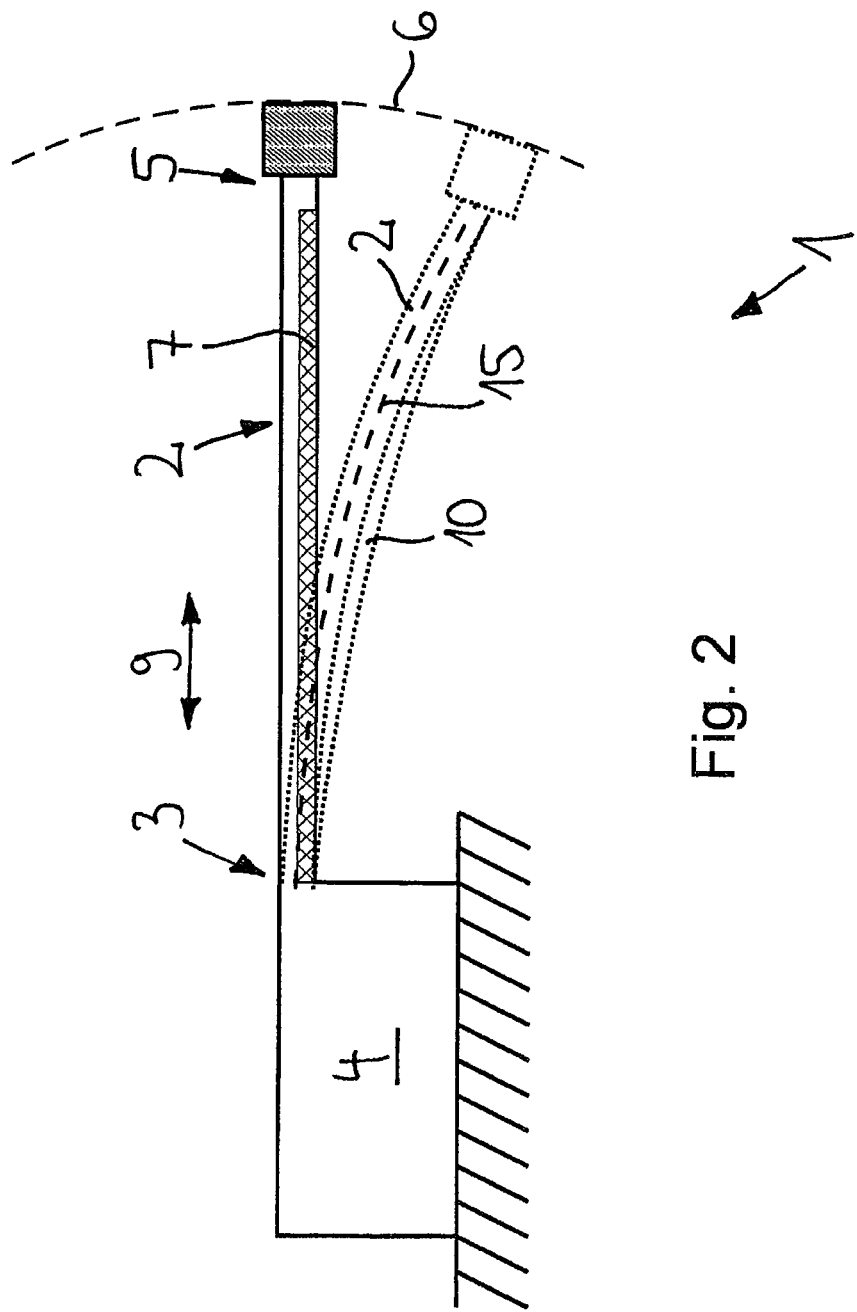

A free end area 5 of the bending bar 2, separated from the fastening point 3, is in a neutral position, in which the bending bar 2 is arranged in a manner corresponding to the drawing plane in FIG. 1 at approximately a right angle to this plane against the reset force of the bending bar 2 material, and is elastically deflectable. As shown in FIG. 2, the free end area 5 of the bending bar 2 moves along a crooked trajectory 6.

To convert mechanical vibration energy into electric energy, an electromechanical converter element 7 is integrated into the bending bar. A Piezo element is provided as the converter element 7, which is arranged on a near-surface layer of the bending bar 2 and is axially stretched or compressed by a bent deformation of the bending bar 2. Due to charge shifting in the Piezo element, an electrical potential occurs in the Piezo element electrodes which feeds an electric load 8 but is not shown in any greater detail in the illustration.

The free end area 5 of the bending bar 2 is connected to the holder 4 via two bridge parts 10 arranged outside the bending bar 2. The bridge parts 10 run parallel to a neutrally positioned bending bar 2 on both sides of the bending bar 2 and are each separated from the bending bar 2 by a slotted space transversely to the longitudinal extension 9 of the bending bar 2. When the bending bar 2 is in a neutral position, the bridge parts 10 and the bending bar 2 are arranged in the same plane.

The bridge parts 10 are securely fastened to the holder 4 by their one end and clamped by the holder 4, which can be elastically deflected at a right angle to the plane in which the bending bar 2 is in its neutral position by their other end. As can be seen in FIG. 1, the end at a distance from the holder 4 of each bridge part 10 is connected to the free end area 5 of the bending bar 2 via a cross-linked part 11. The cross-linked part 11 runs into the plane in which the bending bar 2 is arranged transversely to the longitudinal extension 9 of the bending bar 2 when the bending bar 2 is in its neutral position.

The holder 4, the bending bar 2, the bridge parts 10, and the cross-linked parts 11 are integrally connected. For example, they are preferably plastic. As can be seen in FIG. 1, the bridge parts 10 are each separated from the bending bar 2 by slotted spaces 12 that run approximately parallel to the bending bar 2.

Figure 3:
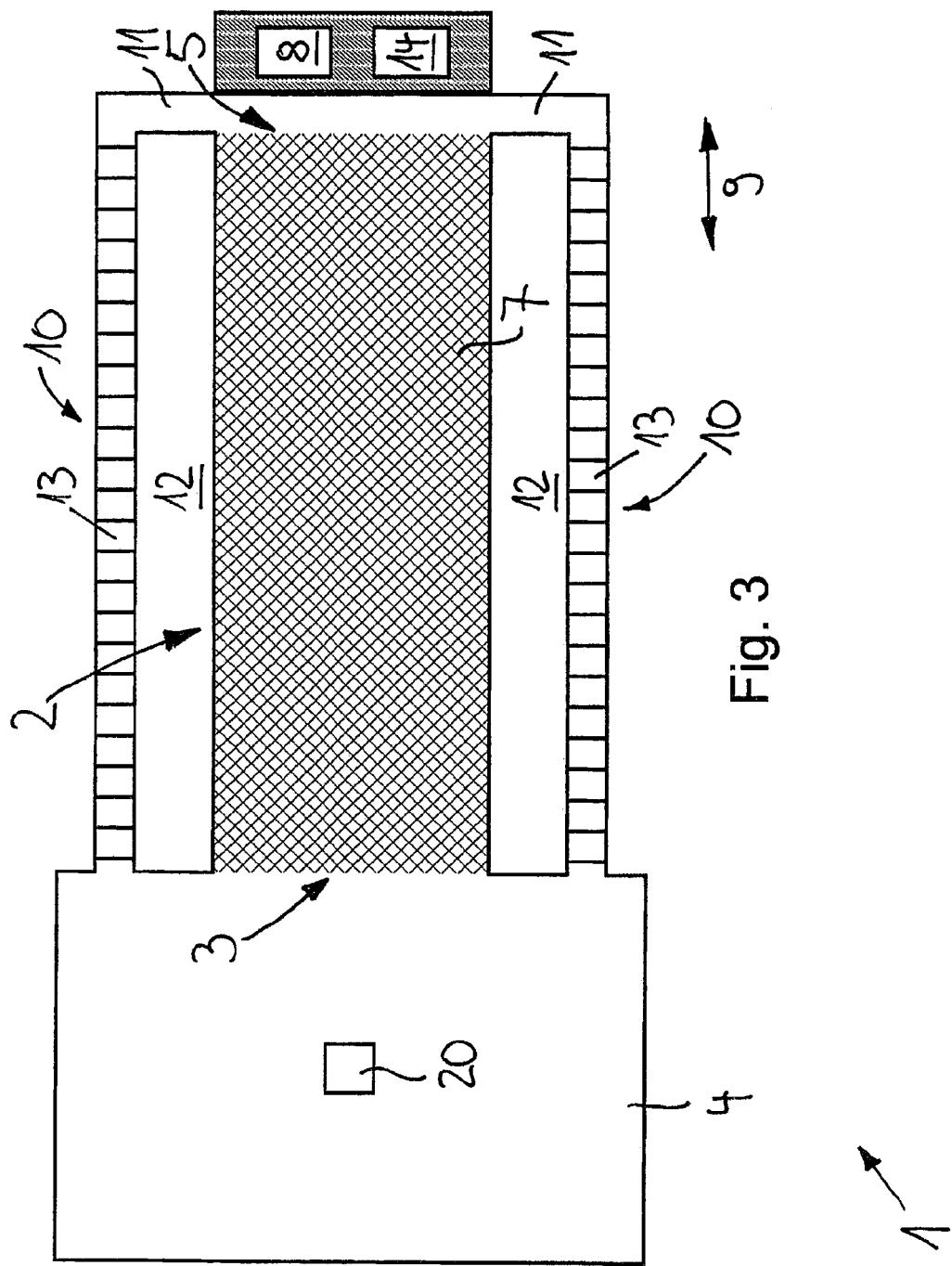

For the purpose of generating a mechanical prestress on the bending bar 2 essentially oriented in the direction of the longitudinal extension 11, a setting mechanism is provided that has a second Piezo element as a setting element for each bridge part 10. The setting element 13 is integrated into the bridge part 10. In the illustrative embodiment in FIGS. 1 and 2, the setting element 13 only spans a section of the bridge part 10. In the illustrative embodiment in FIG. 3, the setting element 13 consistently spans almost the entire length of the bridge part 10. With the help of the setting element 13, the axial length of the bridge part 10 is decreased and/or increased by applying an electrical load to the setting element 13 with the help of a control mechanism 14. If the length of the bridge part 10 is decreased, the resonance frequency of the vibration-capable system created by the bending bar 2 and the bridge part 10 decreases. If the length of the bridge part 10 is increased, the resonance frequency of the vibration-capable system increases.

It can be seen in FIG. 2 that, when the bending bar 2 is deflected from its neutral position, it runs along a crooked deflection curve 15, and the line along which the bridge part 10 runs deviates in the presence of prestress on the bending bar's 2 deflection curve. The curve that the bridge part 10 spans has a different geometry and is shorter than the deflection curve 15.

Figure 4:
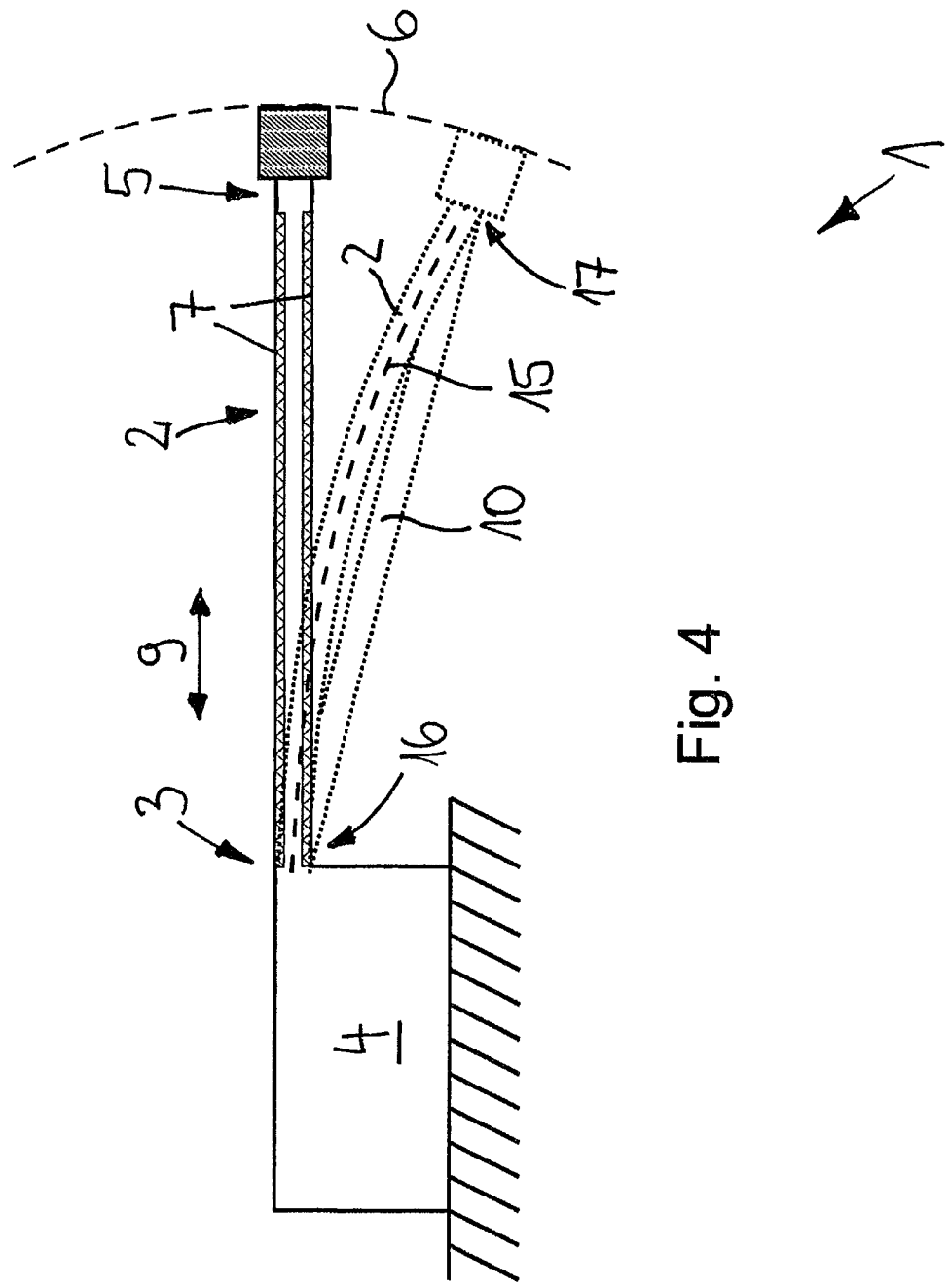

In the illustrative embodiment shown in FIG. 4, the bridge part 10 is connected to a first joint point 16, which is separated from the free end area 5 of the bending bar 2, with the holder 4 via a first pivot joint and deflectably connected to a second joint point 17, which is attached to the free end area 5 of the bending bar 2, with the bending bar 2 via a second pivot joint or cross-linked part 11. Thus, the bridge part 10 has a fairly straight course even when the bending bar 2 is deflected from its neutral position. The pivot joints are advantageously designed as flexure hinges whose pivot axis run normally to the plane that the trajectory 6 spans.

In the illustrative embodiment shown in FIG. 4, the converter element 7 of the bending bar 2 has a Piezo electric layer on either side of the middle layer, which is used for generating electric energy. When the bending bar 2 is deflected from the neutral position, one of the Piezo electrical layers is compressed and the other is stretched.

Figure 5:
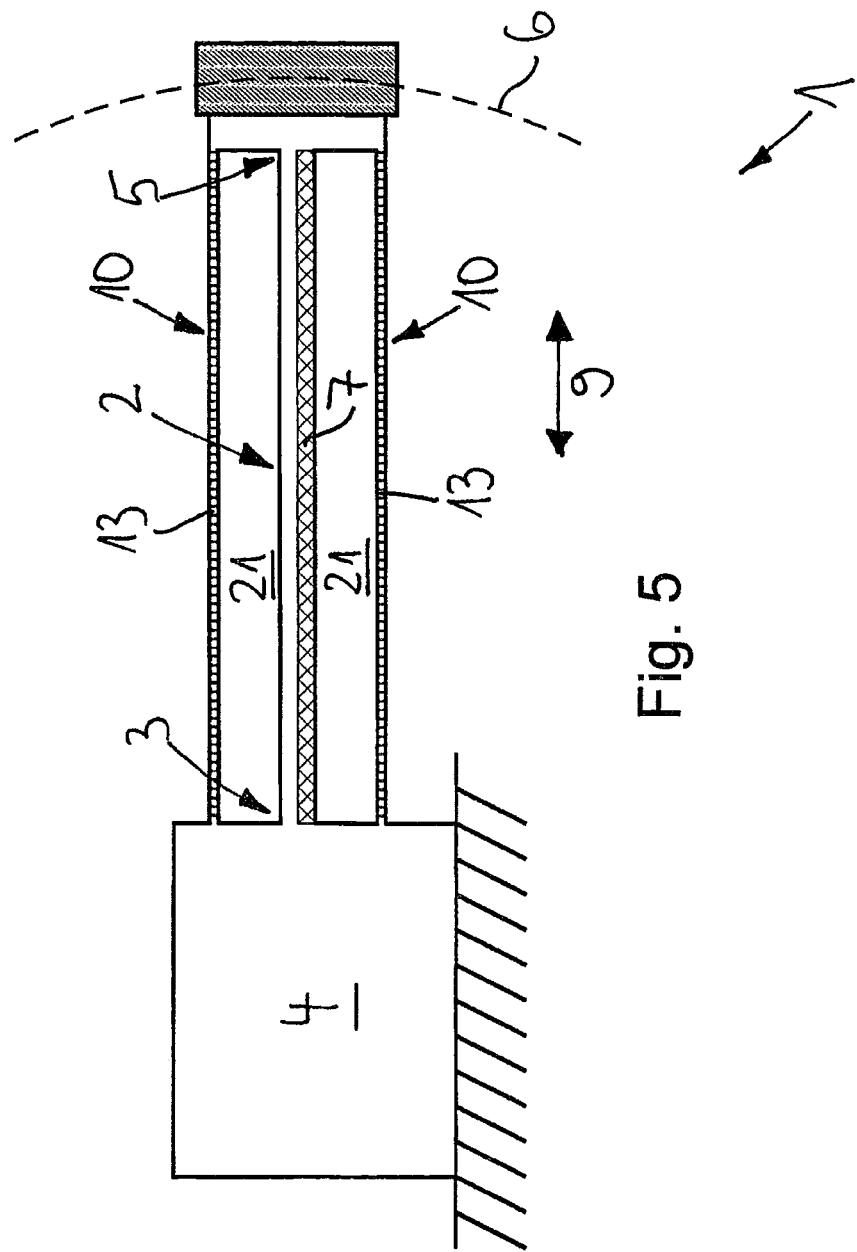

In the illustrative embodiment shown in FIG. 5, the bending bar 2 and both bridge parts 10 are arranged in a neutral position, running on planes parallel to each other. Between the bridge part 10 and the bending bar 2 there is a slotted movement space 21 that runs approximately parallel to the bending bar 2. The bridge parts 10 are arranged to be mirror symmetrical to the longitudinal central axis of the bending bar 2.

Figure 6:
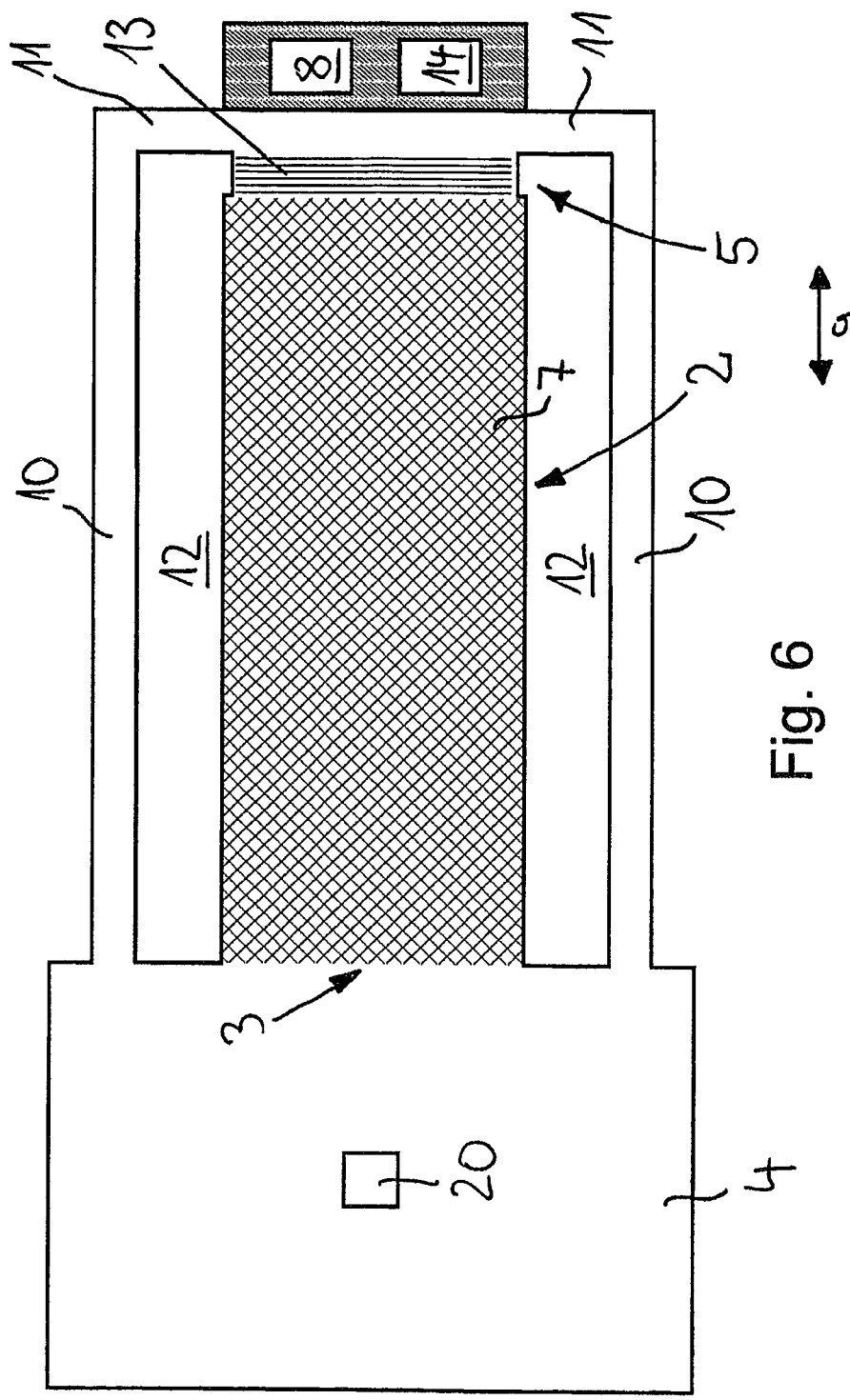

In the illustrative embodiment shown in FIG. 6, the setting element 13 designed as a Piezo element is arranged between the front end of the bending bar 2 and the cross-linked parts 11. Thus it is possible to change the axial length of the bending bar 2 in relation to the axial length of the bridge parts 10 and thereby apply an axial prestress on the bending bar 2. The setting element 13 also acts as a seismic mass.

Figure 7:
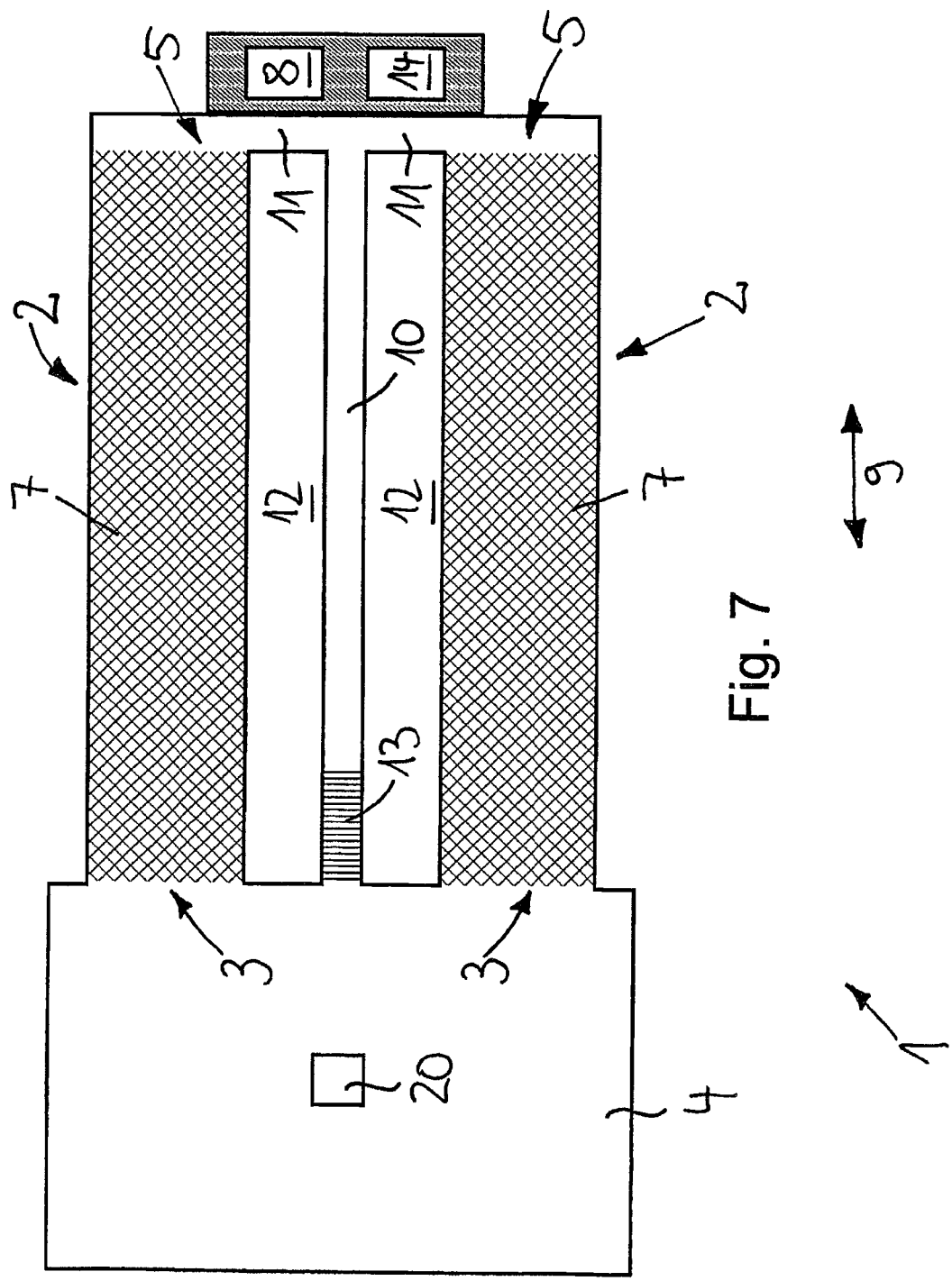

In the illustrative embodiment shown in FIG. 7, the energy converter 1 has two parallel running, bending bars 2 that are unilaterally clamped to the holder 2 and between which a bridge part 10 is likewise unilaterally clamped to the holder 2. When the bending bar 2 is in a neutral position, the bridge parts 10 and the bending bar 2 are arranged on the same plane. The bending bar 2 is separated from the relevant bridge part 10 by a slotted space 12 that runs approximately parallel to the bending bar 2. It is clearly discernable that the bending bar 2 is arranged to be mirror symmetrical to the longitudinal central axis of the bridge part 10.

Figure 8:
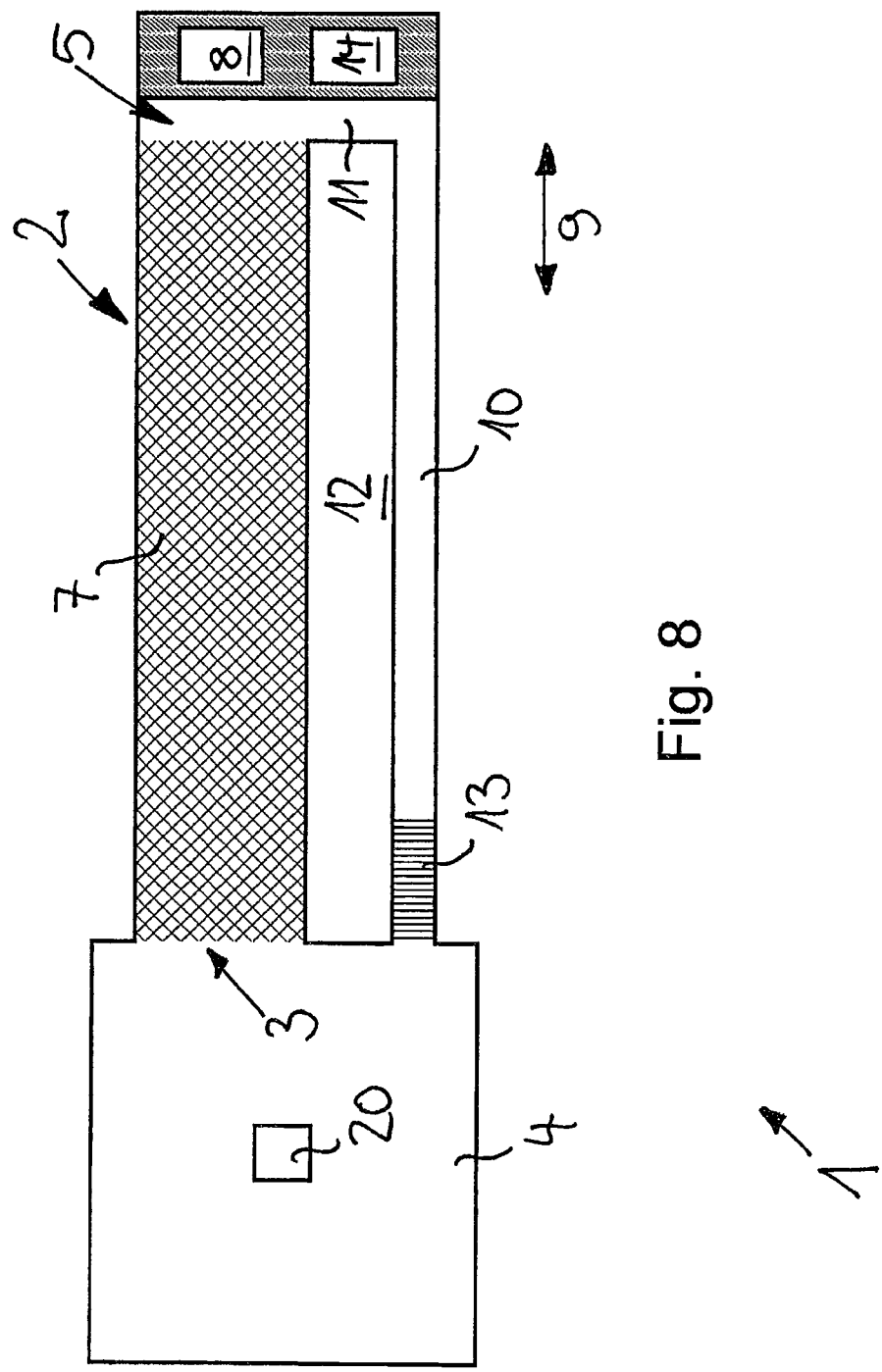

FIG. 8 shows that the bending bar 2 and the bridge part 10 can also be arranged asymmetrically to each other.

Figure 9:
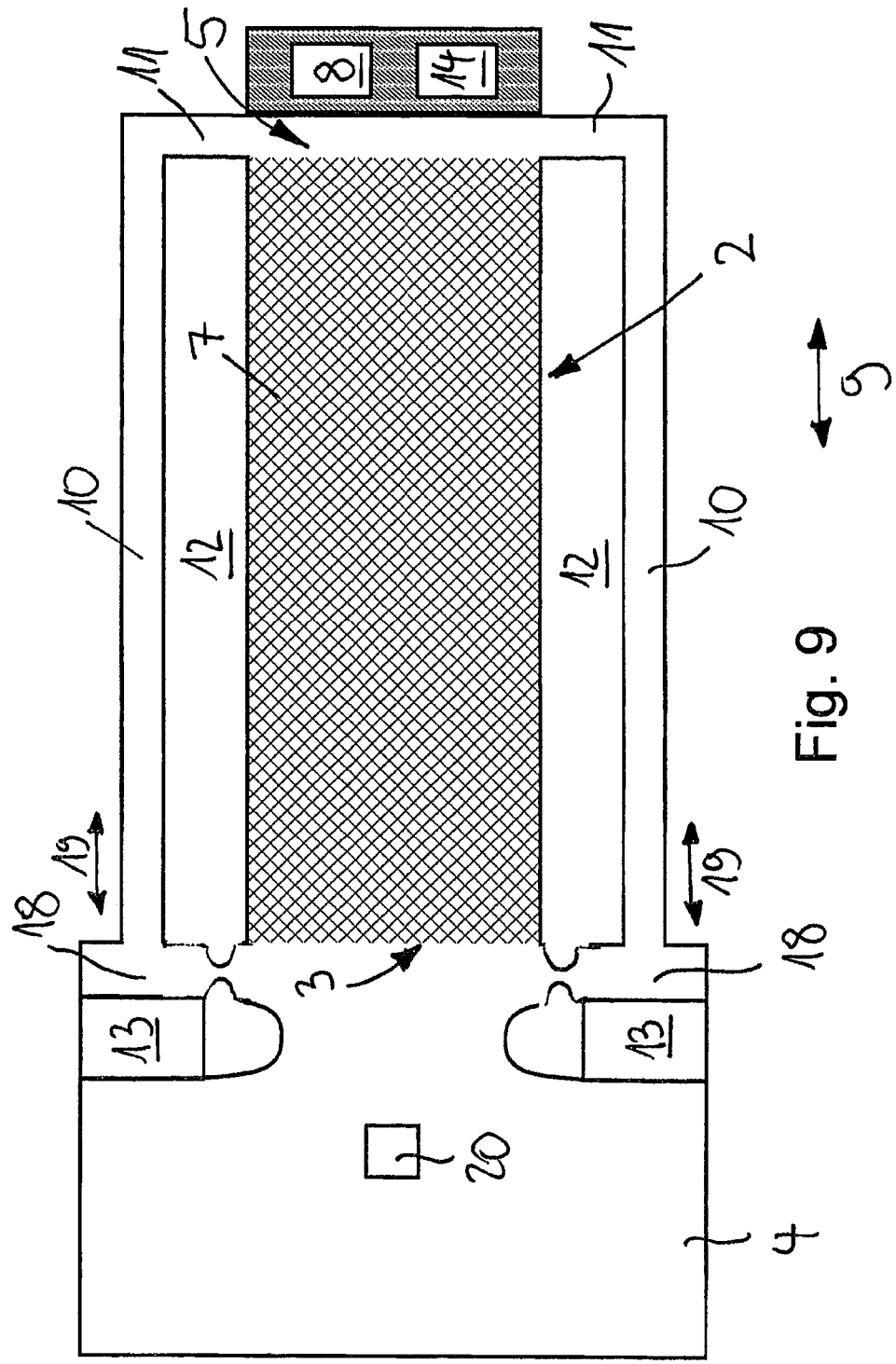

On the energy converter 1 shown in FIG. 9, the holder 4 has two integrally molded arms 18 that are arranged at an approximate right angle to the longitudinal extension 9 of the bending bar 2 and in opposing directions and that are arranged on the plane that the bending bar 2 spans when in its neutral position. Each arm 18 has a section that can be deflected on the longitudinal extension 9 of the bending bar 2 relative to the holder 4. A space 12 is formed on the back side of the bridge parts 10 between this arm section and the holder 4, in which the Piezo element setting element 13 is arranged. The setting element 13 is propped against the deflectable arm section on one end and against a holder 4 bearing point on the other. The deflectable arm sections are each connected to an end of the designated bridge part 10 that is at a distance from the free end area 5 end of the respective arm 18. With the help of setting elements 13, the arms 18 can be displaced in the direction of the bidirectional arrows 19.

Figure 10:
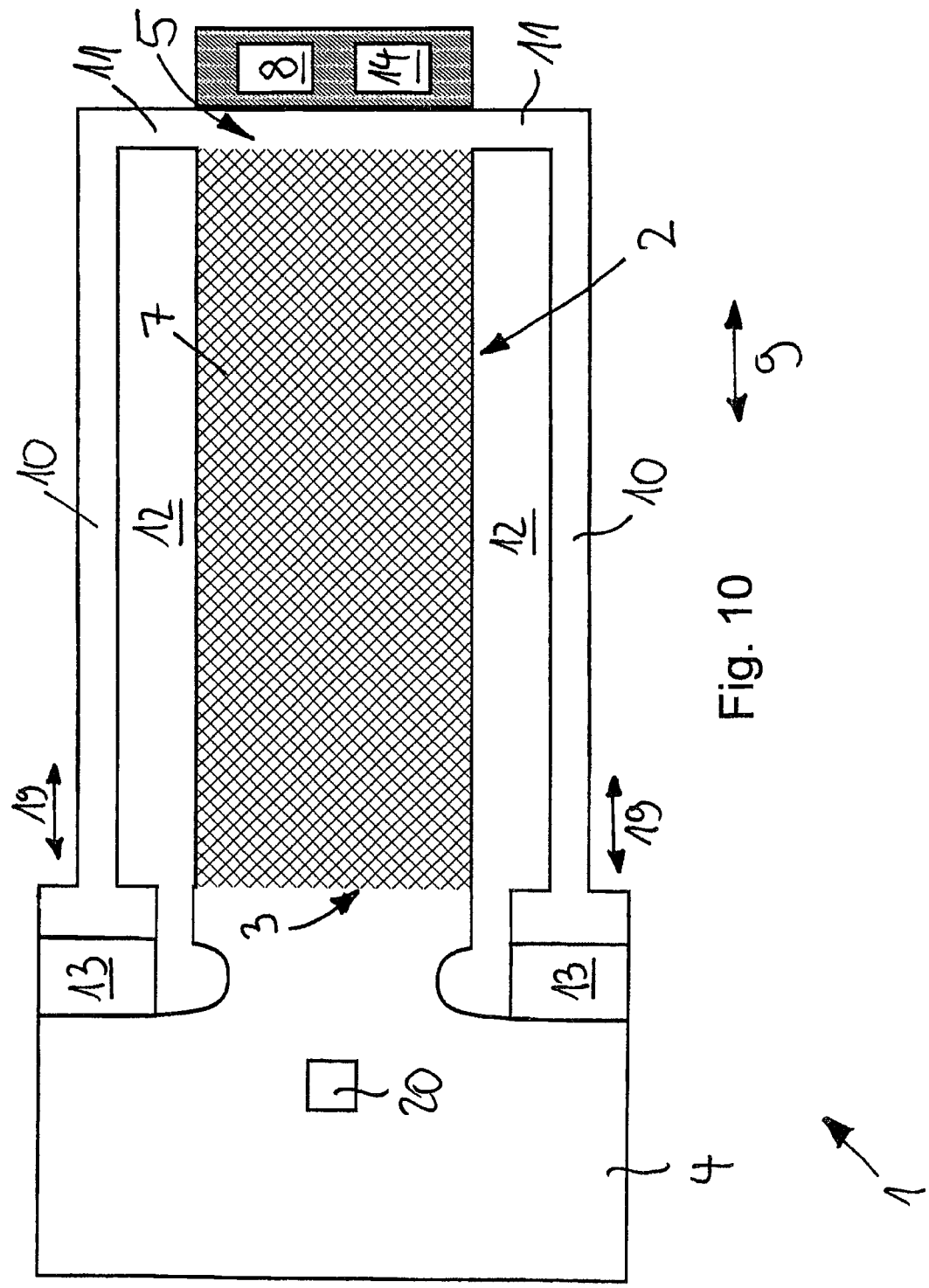

As can be seen in FIG. 10, the setting elements 13 can also be connected to the bridge parts 10 via a separate structure.

It should also be mentioned that the control mechanism 14 has a measurement signal port to which a control signal is connected that is dependent on the frequency of the mechanical excitement vibrations. The control signal is captured with the help of a sensor 20 arranged on the holder 4. The at least one setting element 13 is in contact with the control mechanism 14 in such a way that the mechanical prestress applied to the bending bar 2 is set depending on the frequency of the mechanical vibration so that the mechanical vibration achieves the highest possible efficacy when it is converted into electric energy.

The control mechanism 14 and an electric load 14 connected to a converter element 7 are arranged on the bending bar 2 at a distance from the fastening point 3 and act as a seismic mass.

It should also be mentioned that, for the illustrative embodiments represented in the drawings, a control circuit can also be used in place of the control mechanism 14, so long as it is designed in a way in which the setting element 13 is selected so that the energy converter 1 is operated at a work point at which it emits a maximum output.

The invention claimed is:

1. An electromechanical energy converter for generating electric energy from mechanical movement, with at least one bending bar that is clamped to a holder at a fastening point and that can be deflected at a free end area at a distance from the fastening point along a trajectory from a neutral position transversely to the longitudinal extension of the bending bar, whereby a deflectable part of the bending bar is connected to the holder by at least one deflectable bridge part extending along the bending bar for the purpose of applying a mechanical prestress to the bending bar oriented essentially in the direction of the longitudinal extension of the bending bar which has at least one electromechanical conversion element used for converting mechanical kinetic energy into electric energy, with a setting mechanism for setting the prestress transferred from the bridge part to the bending bar, wherein the bridge part is arranged outside the bending bar in such a way that, at least when the bending bar is deflected out of the neutral position and a prestress exists, the bending bar and the bridge part extend along lines with different courses.

2. The electromechanical energy converter according to claim 1, wherein the bridge part is clamped to the holder and is preferably elastically bendable.

3. The electromechanical energy converter according to claim 1, wherein the bridge part is deflectably connected to the holder at a first joint point, which is separated from the deflectable point of the bending bar, via a first swivel point and/or to the bending bar at a second joint point, which is separated from the fastening point, via a second swivel point, and that a swivel axis of the first swivel point and/or a swivel axis of the second swivel point preferably runs normally to the plane along the trajectory, along which the free end area of the bending bar can be deflected.

4. The electromechanical energy converter as in claim 1, wherein the neutral position of the bending bar, the bending bar and at least one bridge part span the same plane and are normally displaced parallel to each other and the bending bar's longitudinal extension.

5. The electromechanical energy converter as in claim 1, wherein at least one bridge part is separated from the bending bar transversely to the longitudinal extension by a preferably slotted open space spanning the bending bar, and that the bridge part is connected to the deflectable point of the bending bar, at the bridge part's end that is attached to the holder, via a cross-linked part.

6. The electromechanical energy converter as in claim 1, wherein the bending bar and the at least one bridge part are arranged on offset planes to run parallel to each other in their neutral position, in the direction of the trajectory, along which the free end area of the bending bar can be deflected, and are separated from each other in the direction of the trajectory by a movement space.

7. The electromechanical energy converter as in claim 1, wherein at least one converter element is a Piezo element that is integrated into the bending bar and preferably arranged on a layer near the surface of the bending bar.

8. The electromechanical energy converter as in claim 1, wherein the setting mechanism has at least one Piezo element as a controlling element that is integrated between the bridge part and the holder and/or between the bridge part and the bending bar and/or integrated into the bridge part.

9. The electromechanical energy converter as in claim 1, wherein at least one arm is integrally molded to the holder transversely to the longitudinal extensions of the bending bar that has an arm section that can be deflected transversely to the longitudinal extensions of the bending bar relative to the holder, that this arm section is connected to the deflectable point on the bending bar via the bridge part and that the setting element is arranged between the arm section and a bearing point provided on the holder.

10. The electromechanical energy converter as in claim 1, wherein it has at least two bridge parts and that the bending bar is arranged symmetrically between these bridge parts.

11. The electromechanical energy converter as in claim 1, wherein it has at least two bending bars and that the bridge part is arranged symmetrically between these bending bars.

12. The electromechanical energy converter as in claim 1, wherein it has a control mechanism with an input door for a control signal that depends on the frequency of the holder's mechanical vibration, and that the control mechanism is connected to the setting mechanism in such a way that the prestress can be set depending on the frequency of the mechanical vibration.

13. The electromechanical energy converter as in claim 1, wherein the control mechanism and/or an energy store electrically connected to the converter element and/or an electric load attached to a converter element is arranged on the bending bar at a distance from the fastening point, preferably at the free end area of the bending bar.

14. The electromechanical energy converter as in claim 1, wherein it has a measurement mechanism for detecting a change in the electric output emitted by the converter element and means for capturing frequency changes in the bending bar's mechanical vibration, and that the measurement mechanism and the means for capturing frequency change cooperate via a control circuit with a setting mechanism in such a way that a simultaneous capture of frequency and output causes the setting element of the setting mechanism to adjust in terms of a reduction of resonance frequency of the bending bar and/or an increase in frequency and simultaneous capture of output causes the setting element of the setting mechanism to adjust in terms of an increase in resonance frequency of the bending bar.

\* \* \* \* \*

UNITED STATES PATENT AND TRADEMARK OFFICE
CERTIFICATE OF CORRECTION

PATENT NO. : 8,664,834 B2
APPLICATION NO. : 13/127778
DATED : March 4, 2014
INVENTOR(S) : Eichhorn et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 433 days.

Signed and Sealed this
Twenty-ninth Day of September, 2015

Michelle K. Lee
*Director of the United States Patent and Trademark Office*